United States Patent
Volkerink et al.

(10) Patent No.: US 7,279,919 B2
(45) Date of Patent: Oct. 9, 2007

(54) SYSTEMS AND METHODS OF ALLOCATING DEVICE TESTING RESOURCES TO SITES OF A PROBE CARD

(75) Inventors: Erik H. Volkerink, San Jose, CA (US); Klaus Dieter Hilliges, Mountain View, CA (US); Edmundo De La Puente, Cupertino, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 38 days.

(21) Appl. No.: 11/035,580

(22) Filed: Jan. 14, 2005

(65) Prior Publication Data
US 2006/0158203 A1    Jul. 20, 2006

(51) Int. Cl.
*G01R 31/26* (2006.01)
(52) U.S. Cl. .................................. 324/765; 324/158.1
(58) Field of Classification Search ..................... None
See application file for complete search history.

(56) References Cited

U.S. PATENT DOCUMENTS

| | | | |
|---|---|---|---|
| 5,124,636 A * | 6/1992 | Pincus et al. ............ 324/158.1 |
| 5,323,107 A | 6/1994 | D'Souza |
| 5,506,510 A | 4/1996 | Blumenau |
| 5,657,394 A * | 8/1997 | Schwartz et al. ........... 382/151 |
| 5,736,850 A | 4/1998 | Legal |
| 5,797,114 A * | 8/1998 | Roberts et al. ............... 702/57 |
| 6,072,190 A * | 6/2000 | Watanabe et al. ............ 257/48 |
| 6,113,646 A | 9/2000 | Holden |
| 6,157,185 A | 12/2000 | Stone et al. |
| 6,300,786 B1 | 10/2001 | Doherty et al. |
| 6,466,047 B1 | 10/2002 | Doherty et al. |
| 6,677,776 B2 | 1/2004 | Doherty et al. |
| 6,731,127 B2 * | 5/2004 | Watts ......................... 324/765 |
| 6,853,211 B2 * | 2/2005 | Doherty et al. ............. 324/765 |
| 6,856,150 B2 * | 2/2005 | Sporck et al. .............. 324/754 |
| 2003/0221152 A1 | 11/2003 | Volkerink et al. |

* cited by examiner

*Primary Examiner*—Paresh Patel

(57) ABSTRACT

Systems and methods of allocating device testing resources are described. In one aspect, a system for allocating m resources for testing devices to n sites of a probe card configured to electrically connect to respective test site locations on a substrate, where m and n are integers and m<n, is described. The system includes a configurable interconnection network that includes a plurality of connections between resources and the probe card sites. The connections enable each test site location to be connected to at least one of the resources over a minimum number of touchdowns of the probe card onto the test sites. Each of the resources is connectable to at most a number of the probe card sites equal to the minimum number of touchdowns. A method of allocating m resources for testing devices to n sites of a probe card configured to electrically connect to respective test site locations on a substrate, where m and n are integers and m<n, also is described.

28 Claims, 13 Drawing Sheets

---

Determine A Minimum Number Of Touchdowns Of The Probe Card Onto The Test Sites Allowing Each Test Site Location To Be Electrically Connected To At Least One Respective Probe Card Site — 50

Determine A Set Of Connections Between The Resources And The Probe Card Sites Enabling Each Test Site Location To Be Connected To At Least One Resource, Wherein Each Resource Is Connectable To At Most A Number Of The Probe Card Sites Equal To The Minimum Number Of Touchdowns — 52

SYSTEMS AND METHODS OF ALLOCATING DEVICE TESTING RESOURCES TO SITES OF A PROBE CARD

BACKGROUND

An electronic circuit tester (or automated test equipment) is designed to test the performance of a device or an integrated circuit (IC). An electronic circuit tester may be used to test finished packaged devices and integrated circuits at various stages of manufacture of the device or an integrated circuit from the initial substrate processing stage to the final packaging stage.

A conventional programmable electronic circuit tester typically includes a test head that is electrically connected to one or more racks of electronic test and measurement instruments (e.g., AC and DC electrical signal generators, and signal analyzers, such as an oscilloscope and a network analyzer). The test head typically interfaces to a device or an integrated circuit through a load board that, in turn, is connected to a probe card (or fixture board). An electronic circuit tester typically includes a separate test channel for each terminal of a device to be tested. Each test channel is connected to a device testing resource that transmits a test signal to a device terminal and receives and processes one or more output signals appearing at respective terminals of the device. A single device testing resource may be connected to a single test channel in a per pin architecture or it may be connected to multiple test channels in a shared architecture. The load board and probe card assemblies provide signal paths between the circuit boards that are mounted in the test head and the terminals of a device to be tested. In general, the configuration of the load board depends on the category (e.g., analog or digital) of device or integrated circuit being tested. The configuration of the probe card, on the other hand, typically is specific to the family of devices or integrated circuits being tested. The test head may be mounted pivotally on a dolly or other adjustable support mechanism so that the electronic circuit tester may be used to test both packaged devices and integrated circuits.

FIGS. 1 and 2 show an embodiment of an electronic circuit tester 10 (e.g., an ATE system available from Agilent Technologies, Inc. of Palo Alto, Calif., U.S.A.) that includes a test head 12 and a rack 14 of electronic test and measurement instruments, which may include, for example, AC and DC electrical signal generators, and signal analyzers, such as an oscilloscope and a network analyzer. The test head 12 is electrically connected by cables that are routed through a conduit 16 to the rack 14 of electronic test and measurement instruments. A load board 18 provides a set of test connectors for interfacing the test channels within test head 12 with a probe card 20. The test head 12 typically contains a plurality of printed circuit boards that contain electrical circuitry that define test channels for testing a device or an integrated circuit. The load board 18 physically routes electrical test signals from the printed circuit boards in the test head 12 to a physical format that enables direct interfacing to the probe card 20. In some embodiments, load board 18 also may contain test circuitry.

In operation, each circuit board in the test head 12 includes a plurality of device testing resources 21, including pairs of drivers and receivers that define test channels of the electronic circuit tester 10. The drivers transmit output signals to the output test connectors of the load board 18 and the receivers receive input signals from the input test connectors of the load board 18. Typically, there are a plurality of pairs of drivers and receivers on a single circuit board. Each circuit board also may include a parametric measurement unit that is configured to quantify or measure signals and to provide calibration data for the drivers and receivers. Typically, multiple pairs of relays are configured to route signals to respective pairs of drivers and receivers of each circuit board. In operation, one set of relays selectively connects and disconnects the drivers and receivers from the load board test connectors, and another set of relays selectively connects and disconnects the test connectors to, for example, the parametric measurement unit.

In other embodiments, the device testing resources are located on circuit boards mounted inside the rack 14 of electronic test and measurement instruments.

The probe card 20 may connect to load board 18 through a plurality of test connectors (e.g., pogo pins or mating electrical connectors). The probe card 20 has multiple sites for concurrently interfacing with multiple respective test sites on a substrate 22. Each probe card site typically includes a pattern of probe connectors 24 corresponding to the pattern of contacts of a test site on a die of the substrate 22. Probe card 20 contains conductive traces that route electrical test signals from the load board 18 to the probe connectors 24. In some implementations, the probe connectors 24 are probe needles that are precision-manufactured so that they terminate in a common plane.

In operation, test signals are transmitted from the test channels of the test head 12 to drive selected terminals of the integrated circuits on the substrate 22. Response signals are transmitted from selected terminals of the integrated circuits to the corresponding test channels of the test head 12. By controllably varying the output levels of the test signals and monitoring the response signals, the electronic circuit tester 10 may test the functional operation of the integrated circuits on substrate 22 and may verify whether the components of the integrated circuits are operating within specified tolerance values or ranges.

Test head 12 may be mounted pivotally on a dolly 26 or other adjustable support mechanism so that electronic circuit tester 10 may be used to test both packaged devices and integrated circuits. The pivotable connections enable test head 12 to be positioned in an approximately upward facing horizontal position to enable an operator to mount an appropriate load board and probe card to the test head 12. The test head 12 may be pivoted to a downward facing horizontal position to enable the probe card 20 to interface with electrical terminals of the integrated circuits on the substrate through the probe connectors 24.

The operation of the electronic circuit tester 10 typically is controlled by an application program executing on a computer 28. The application program may be implemented by one or more respective software modules. In some implementations, each test channel includes a respective test processor, and the computer 28 downloads application programs to the test processors for execution.

Some electronic circuit testers are designed to test multiple semiconductor devices that are arranged in die regions of semiconductor wafers. These testers typically include in the test head a prober that holds a semiconductor wafer. In operation, the prober moves the wafer so that different test site locations on the wafer are aligned with the probe card. In some designs, the devices are tested one die at a time. Other designs include probe cards that have multiple sites for testing multiple devices on different respective dice at the same time.

Typically, the testing sites on the probe card are arranged in a rectangular array and the number of probe card sites equals the number of device testing resources in the electronic circuit tester. The test site locations on semiconductor wafers, however, typically are arranged in non-rectangular arrays. Therefore, during some touchdowns of the probe card onto the test site locations, some of the probe card sites do not contact test site locations, reducing the utilization of the device testing resources.

For example, FIG. 3A shows an exemplary array of test site locations 30 on a substrate 32. Each test site location 30 typically corresponds to a die on the substrate 32 and includes a plurality of contacts that allow at least one integrated circuit in the die to be tested. FIG. 3B shows a probe card 34 superimposed on the substrate 32 at four different touchdown positions, which are labeled A, B, C, and D. The probe card 34 includes a square array of four testing sites that are arranged to coincide with the test site locations 30. In the illustrated example, the load board 18 (FIG. 2) connects each testing site of the probe card 32 to a respective device testing resource of the electronic circuit tester 10 with a fixed (i.e., non-configurable) electrical connection. Due to the mismatch between the non-rectangular array of test site locations 30 and the square array of testing sites on the probe card 34, one probe card testing site (highlighted dark gray in FIG. 3B) in each touchdown position is not aligned with a corresponding test site location 30. As a result, only 75% of the device testing resources are used during each touchdown. Thus, the fixed resource allocation provided by this example achieves a resource utilization of only 75%.

Configurable probe cards have been proposed to address this problem and thereby increase resource utilization. These configurable probe cards contain probe wires or other contact mechanisms for more test sites than the number of available device testing resources. These probe cards typically include a switch array that is placed between the device testing resources and the probe wires to change which of the sites on the probe card are connected to the device testing resources. For example, FIG. 4 shows a multiplex matrix 40 that includes n×m switches 42 that allow m resources to connect to n probe card sites, where m and n are integers. In this example, m sets of n switches enable each resource to be connected to each of the n probe card sites. The multiplex matrix 40 allows the m resources to be allocated to different sets of m probe card sites for different touchdowns in a way that increases the utilization of the device testing resources. For example, with respect to the exemplary probe card 34 shown in FIG. 3B, a three-by-four multiplex matrix could be used to allocate three device testing resources to the three active probe card sites in each of the four touchdowns A, B, C, D. In this case, the utilization of the three resources would be 100%.

In some implementations of the configurable probe cards that have been proposed, some of the device testing resources may be connected directly to probe card sites. However, a large number of switches are required to connect the device testing resources to the probe card sites with the switching flexibility needed to achieve high resource utilization. The large number of required switches makes these approaches costly and limits the frequencies at which the devices can be tested due to the high site loads. In addition, the physical wiring requirements of these approaches limit the size of the probe card, thereby increasing the number of touchdowns required to test the devices on a wafer.

SUMMARY

In one aspect, the invention features a system for allocating m resources for testing devices to n sites of a probe card configured to electrically connect to respective test site locations on a substrate, where m and n are integers and m<n. The system includes a configurable interconnection network that includes a plurality of connections between resources and the probe card sites. The connections enable each test site location to be connected to at least one of the resources over a minimum number of touchdowns of the probe card onto the test sites. Each of the resources is connectable to at most a number of the probe card sites equal to the minimum number of touchdowns.

In another aspect, the invention features a method of allocating m resources for testing devices to n sites of a probe card configured to electrically connect to respective test site locations on a substrate, where m and n are integers and m<n. In accordance with this inventive method, a minimum number of touchdowns of the probe card onto the test site locations enabling each test site location to be electrically connected to at least one respective probe card site is determined. A set of connections between the resources and the probe card sites enabling each test site location to be connected to at least one of the resources is determined. The connections are determined so that each of the resources is connectable to at most a number of the probe card sites equal to the minimum number of touchdowns.

In another aspect, the invention features a system for allocating resources for testing devices to sites of a probe card configured to electrically connect to respective test site locations on a substrate. The system includes a configurable interconnection network comprising a plurality of connections between resources and the probe card sites enabling each test site location to be connected to at least one of the resources. At least some of the connections of the configurable interconnection network are located on the substrate.

In another aspect, the invention features a machine-implemented method of allocating resources for testing devices. In accordance with this inventive method, test sites on multiple substrates are contacted, and the resources are concurrently connected to selected ones of the contacted test sites on different ones of the substrates to maximize utilization of the resources.

In another aspect, the invention features a system for allocating resources for testing devices. The system includes multiple probe cards that are configured to contact test sites on multiple substrates, a configurable interconnection network, and a controller. The configurable interconnection network is operable to connect the resources to sites on the probe cards. The controller is operable to configure the interconnection network to concurrently connect the resources to selected ones of the test sites on different ones of the substrates to maximize utilization of the resources.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
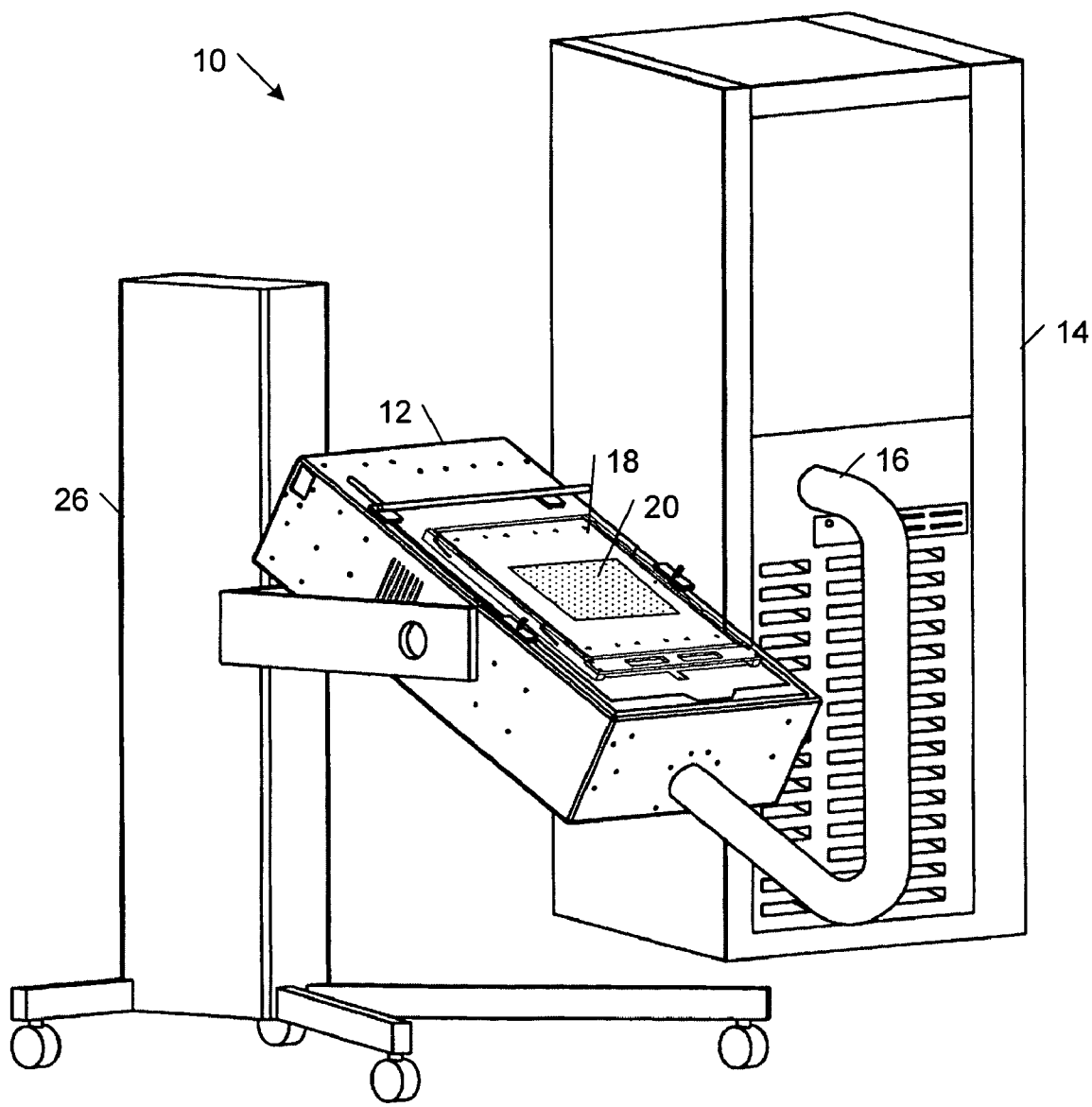
FIG. 1 is a diagrammatic perspective view of an electronic circuit tester and a probe card mounted on a load board that is connected to a test head of the electronic circuit tester.
Figure 2:
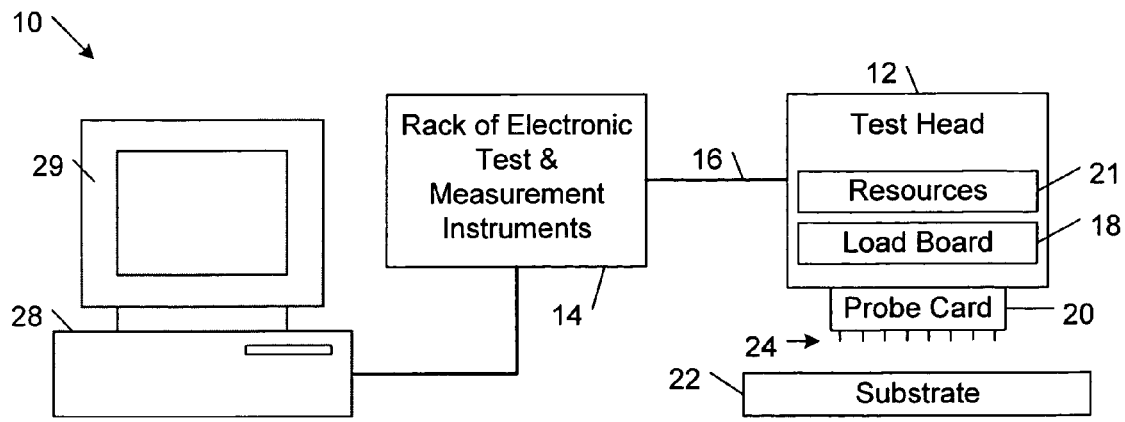
FIG. 2 is a block diagram of the electronic circuit tester of FIG. 1.

The embodiments that are described in detail below include configurable interconnection networks that allocate the device testing resources of an electronic circuit tester (e.g., the electronic circuit tester 10 shown in FIGS. 1 and 2) in ways that increase resource utilization while reducing the number of required switches and reducing the loads on the probe card sites. In this way, these embodiments are less costly to manufacture and are capable of operating at higher frequencies relative to prior approaches to increasing utilization of the device testing resources. In general, the configurable interconnection networks include resource allocation components that may be disposed at one or more locations along the communications paths between the device testing resources and the devices to be tested. For example, the components of the configurable interconnection networks may be located in the rack 14, the test head 12, the probe card 20, the substrate 22 (e.g., in the scribe lines between adjacent dice on a semiconductor wafer, as described below) or distributed across multiple ones of the rack 14, the test head 12, the probe card 20, and the substrate 22.

I. Allocating Device Testing Resources to Sites on a Single Probe Card

A. Using a Full Multiplex Matrix to Configurably Allocate Resources

There are three important metrics for evaluating a multiplex architecture for allocating resources to probe card sites: (1) the number of switches; (2) the fan-out of the switches (e.g., 1:1, 1:2, 1:4, etc.); and (3) the probe card site load (i.e., the number of switches that are connected to the probe card sites. In general, the cost and performance of the multiplex architecture is improved when one or more of the number of switches is reduced, the fan-out of the switches is reduced, and the probe card site load is reduced.

Figure 4:
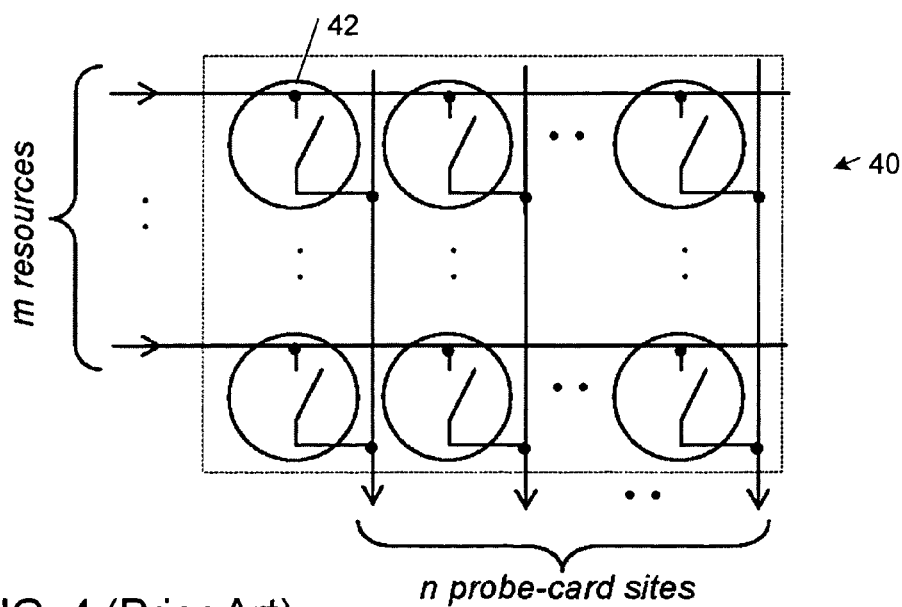
FIG. 4 is a diagrammatic view of a multiplex matrix for configurably allocating device testing resources among the sites of a probe card.

The multiplex matrix 40 shown in FIG. 4 has n×m switches, each of which has a fan-out of 1:1, and the probe card site load is m (i.e., each probe card site is connected to m switches). In practical implementations, the values of m and n typically are large (e.g., in some implementations, m is on the order of 32 and n is on the order of 50). As a result, in these implementations, the multiplex matrix 40 includes a large number of switches, increasing the cost of the multiplex matrix and the difficulty of wiring all of the contacts of each probe card site through the multiplex matrix 40. The high site load also imposes significant limits on the bandwidth of the device testing signals.

B. Improved Configurable Allocations of Resources

The embodiments described below efficiently allocate the device testing resources to the probe card sites in a way that achieves improved cost and performance relative to the full multiplex matrix 40 shown in FIG. 4. In general, these improvements are achieved by selectively connecting each resource to a reduced number of the possible probe card sites.

Figure 5:
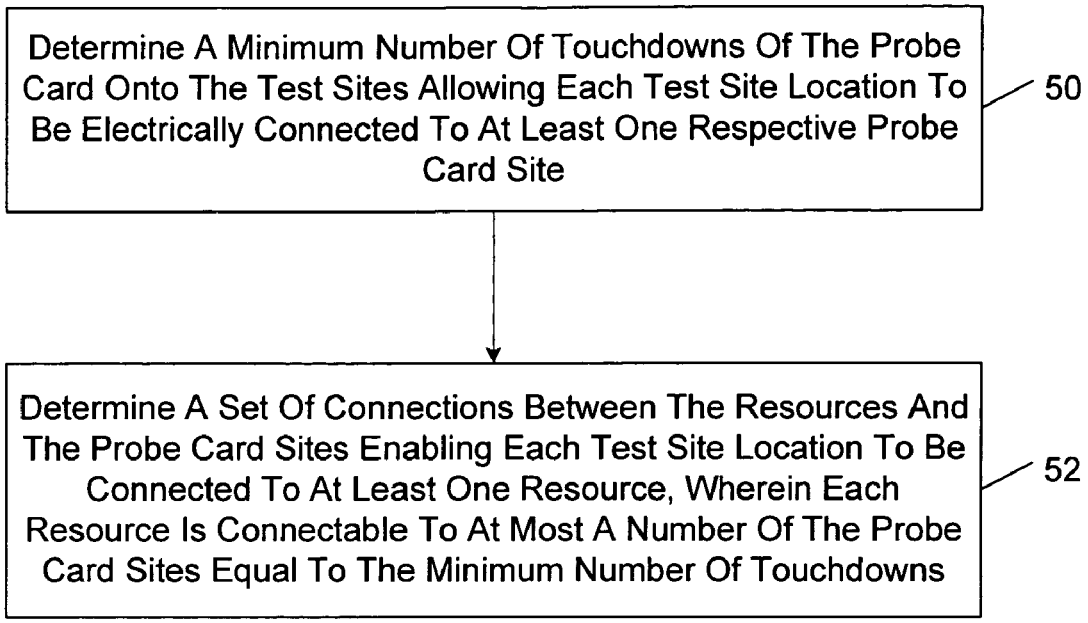
FIG. 5 is a flow diagram of an embodiment of a method of allocating device testing resources among the sites of a probe card.

FIG. 5 shows an embodiment of a method of allocating m device testing resources to n testing sites of a probe card, where m and n are integers and m<n.

Figure 3A:
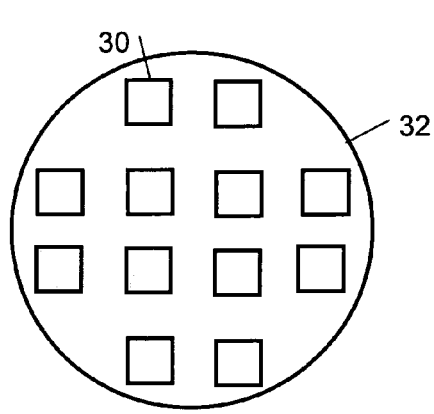
FIG. 3A is a diagrammatic view of an array of test site locations on a substrate.
Figure 3B:
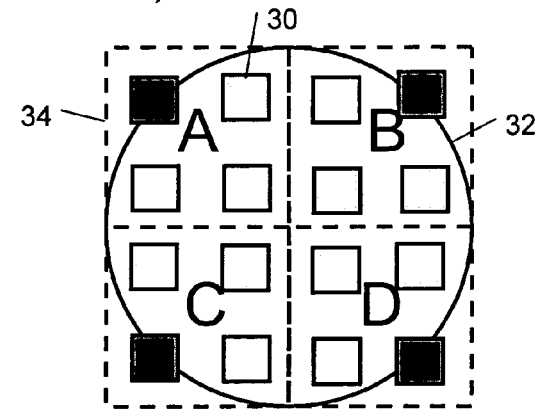
FIG. 3B is a diagrammatic view of a probe card superimposed on the substrate shown in FIG. 3A at four different touchdown positions.

In this embodiment, a minimum number of touchdowns of the probe card onto the test site locations on a substrate that allows each test site location to be electrically connected to at least one respective probe card site is determined (block 50). The minimum number of touchdowns may be determined by using any one of a wide variety of known covering or tiling methods. In general, the minimum number of touchdowns depends on the numbers and arrangements of the probe card sites and the test site locations. With reference to the example shown in FIG. 3B, the minimum number of touchdowns of the four-site probe card 32 onto the twelve test site locations 30 on substrate 32 is four.

After the minimum number of touchdowns has been determined (block 50), a set of connections between the resources and the probe card sites that enables each test site to be connected to at least one resource is determined (block 52). The connections are selected so that each resource is connectable to at most the same number of the probe card sites as the minimum number of touchdowns.

Figure 6:
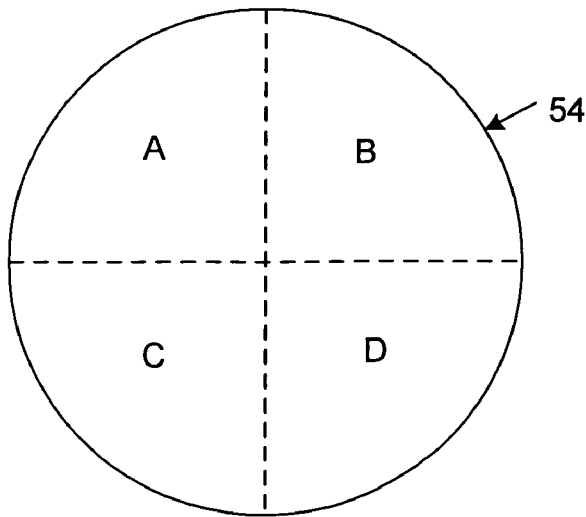
FIG. 6 is a diagrammatic view of a substrate divided into four touchdown regions.

Different methods of determining the set of connections between the resources and the probe card sites are described below. In general, these methods involve identifying respective sets of active ones of the probe card sites that are electrically connectable to respective ones of the test sites during each of the touchdowns. For illustrative purposes, some of these embodiments are described with reference to the exemplary case shown in FIG. 6 in which the minimum number of probe card touchdowns onto the substrate 54 is four. The touchdown regions on the substrate 54 are labeled A, B, C, and D.

1. Symmetric Resource Allocations

Figure 7:
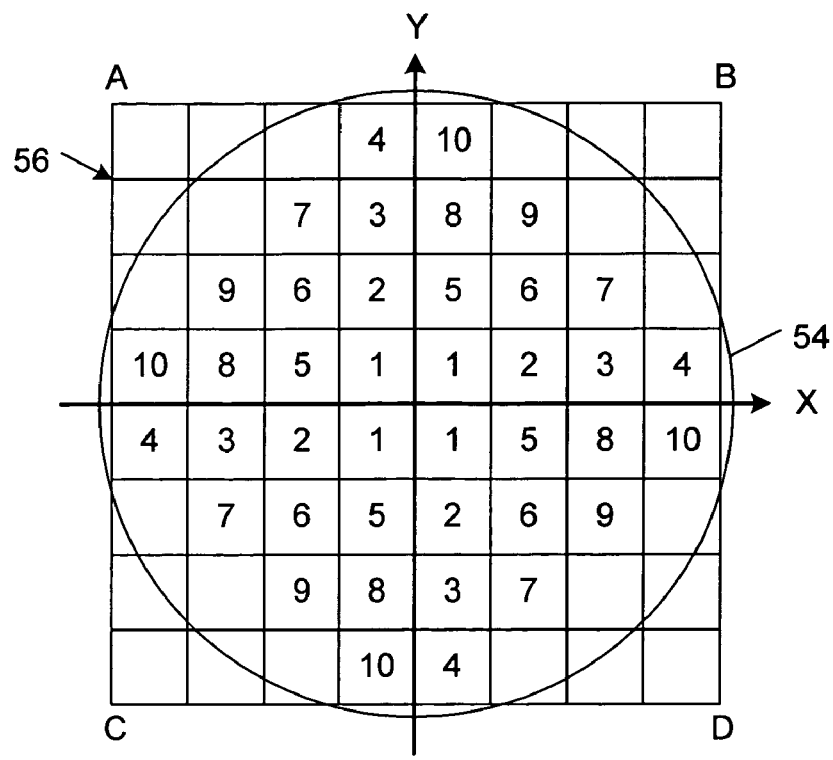
FIG. 7 shows four rotation-symmetric allocations of resources among the sites of a probe card for the four touchdown regions shown in FIG. 6.

FIG. 7 shows an embodiment in which the set of connections between the resources and the probe card sites is determined by rotating the resource allocation around the center of the substrate 54 to the four touchdown regions A, B, C, D. In the illustrated embodiment, there are four rotation-symmetric allocations of ten resources (numbered 1 through 10) among the sixteen sites of a probe card 56 for the four touchdown regions A, B, C, D.

If the probe card sites for a touchdown are numbered according to the coordinates along the X and Y axes shown in FIG. 7, the allocation of each resource for the four touchdowns is given by {(x,y), (−y,x), (−x,−y), (y,−x)}. Table 1 presents a mapping of the resources to the probe card sites for each of the touchdowns.

TABLE 1

| | Touchdown | | | | | | | |
|---|---|---|---|---|---|---|---|---|
| | A | | B | | C | | D | |
| Name | x | y | x | y | x | y | x | y |
| 1 | −1 | 1 | 1 | 1 | −1 | −1 | 1 | −1 |
| 2 | −1 | 2 | 2 | 1 | −2 | −1 | 1 | −2 |
| 3 | −1 | 3 | 3 | 1 | −3 | −1 | 1 | −3 |
| 4 | −1 | 4 | 4 | 1 | −4 | −1 | 1 | −4 |
| 5 | −2 | 1 | 1 | 2 | −1 | −2 | 2 | −1 |
| 6 | −2 | 2 | 2 | 2 | −2 | −2 | 2 | −2 |
| 7 | −2 | 3 | 3 | 2 | −3 | −2 | 2 | −3 |
| 8 | −3 | 1 | 1 | 3 | −1 | −3 | 3 | −1 |
| 9 | −3 | 2 | 2 | 3 | −2 | −3 | 3 | −2 |
| 10 | −4 | 1 | 1 | 4 | −1 | −4 | 4 | −1 |
| (x, y) | −y | x | x | y | −x | −y | y | −x |

In this embodiment, each resource is connected to a respective one-to-four (1:4) multiplexer. Therefore, each resource is connectable to at most a number of the probe card sites equal to the minimum number of touchdowns (i.e., four).

In addition, each probe card site is connected to at most three of the 1:4 multiplexers. In particular, assuming the probe card sites are numbered in raster-scan fashion from upper left corner to lower right corner, the site loads of probe card sites 2, 3, 5, 8, 9, 12, 14, and 15 is two 1:4 multiplexers. For example, probe card site 2 connects to the resources 3 and 5 during touchdowns C and D. The site loads of probe card sites 1, 4, 6, 7, 10, 11, 13, and 16 is three 1:4 multiplexers. For example, probe card site 1 connects to resources 10, 4, and 1 during touchdowns B, C, and D.

As shown in Table 2, the rotation-symmetric resource allocation shown in FIG. 7 has significantly fewer switches and a better site load characteristic than the multiplex matrix 40 shown in FIG. 4. In this case, m=10 and n=16.

TABLE 2

| Architecture | Number of MUX's | MUX Type | Site Load (for % of sites) |
|---|---|---|---|
| Multiplex Matrix Architecture | 160 | 1:1 | 10 for 100% |
| Rotation-Symmetric Architecture | 10 | 1:4 | 2 for 50% 3 for 50% |

Figure 8:
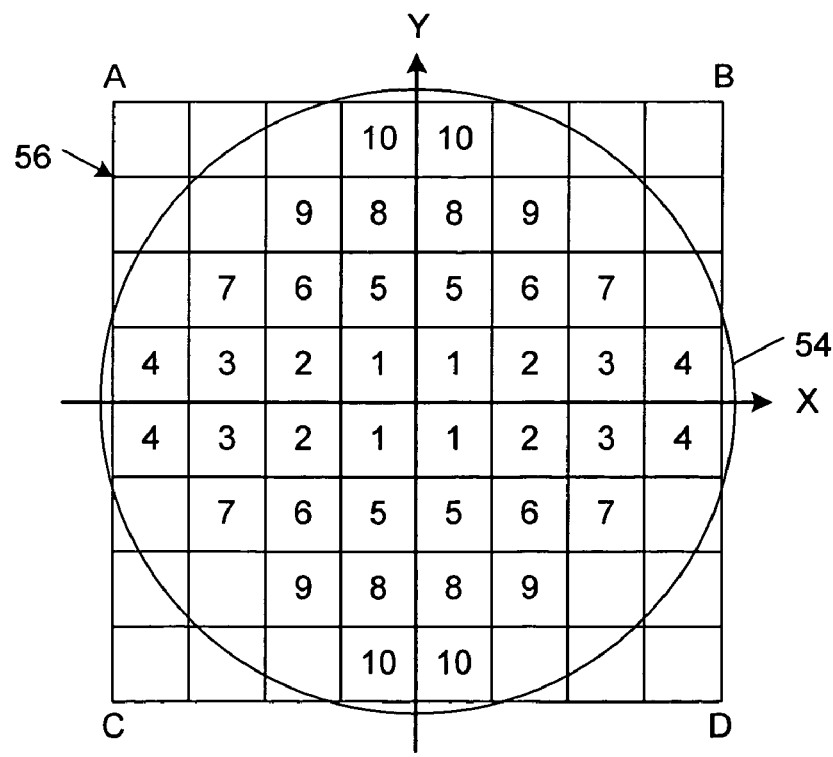
FIG. 8 shows four mirror-symmetric allocations of resources among the sites of a probe card for the four touchdown regions shown in FIG. 6.

FIG. 8 shows an embodiment in which the set of connections between the resources and the probe card sites is determined by reflecting the resource allocation about the X and Y axes to the four touchdown regions A, B, C, D. In the illustrated embodiment, there are four mirror-symmetric allocations of ten resources (numbered 1 through 10) among the sixteen sites of the probe card 56 for the four touchdown regions A, B, C, D.

If the probe card sites for a touchdown are numbered according to the coordinates along the X and Y axes shown in FIG. 8, the allocation of each resource for the four touchdowns is given by {(x,y), (−x,y), (x,−y), (−y,−x)}. Table 3 presents a mapping of the resources to the probe card sites for each of the touchdowns.

TABLE 3

| | Touchdown | | | | | | | |
|---|---|---|---|---|---|---|---|---|
| | A | | B | | C | | D | |
| Name | x | y | x | y | x | y | x | y |
| 1 | −1 | 1 | 1 | 1 | −1 | −1 | 1 | −1 |
| 2 | −2 | 1 | 2 | 1 | −2 | −1 | 2 | −1 |
| 3 | −3 | 1 | 3 | 1 | −3 | −1 | 3 | −1 |
| 4 | −4 | 1 | 4 | 1 | −4 | −1 | 4 | −1 |
| 5 | −1 | 2 | 1 | 2 | −1 | −2 | 1 | −2 |
| 6 | −2 | 2 | 2 | 2 | −2 | −2 | 2 | −2 |
| 7 | −3 | 2 | 3 | 2 | −3 | −2 | 3 | −2 |
| 8 | −1 | 3 | 1 | 3 | −1 | −3 | 1 | −3 |
| 9 | −2 | 3 | 2 | 3 | −2 | −3 | 2 | −3 |
| 10 | −1 | 4 | 1 | 4 | −1 | −4 | 1 | −4 |
| (x, y) | −x | y | x | y | −x | −y | x | −y |

In this embodiment, each resource is connected to a respective one-to-four (1:4) multiplexer. Therefore, each resource is connectable to at most a number of the probe card sites equal to the minimum number of touchdowns (i.e., four).

In addition, each probe card site is connected to at most three of the 1:4 multiplexers. In particular, assuming the probe card sites are numbered in raster-scan fashion from upper left corner to lower right corner, the site loads of probe card sites 2, 3, 5, 8, 9, 12, 14, and 15 is two 1:4 multiplexers. For example, probe card site 2 connects to the resources 3 and 2 during touchdowns C and D. The site loads of probe card sites 1, 4, 6, 7, 10, 11, 13, and 16 is three 1:4 multiplexers, For example, probe card site 1 connects to resources 10, 4, and 1 during touchdowns B, C, and D.

As shown in Table 4, the mirror-symmetric resource allocation shown in FIG. 8 has significantly fewer switches and a better site load characteristic than the multiplex matrix 40 shown in FIG. 4. In this case, m=10 and n=16.

TABLE 4

| Architecture | Number of MUX's | MUX Type | Site Load (for % of sites) |
|---|---|---|---|
| Multiplex Matrix Architecture | 160 | 1:1 | 10 for 100% |
| Mirror-symmetric Architecture | 10 | 1:4 | 2 for 50% 3 for 50% |

2. Cluster-Based Resource Allocations

In the following embodiment, one or both of the number of multiplexers and the probe card sites loads are reduced by selectively clustering probe card sites and allocating the resources among corresponding clusters of probe card sites.

Figure 9:
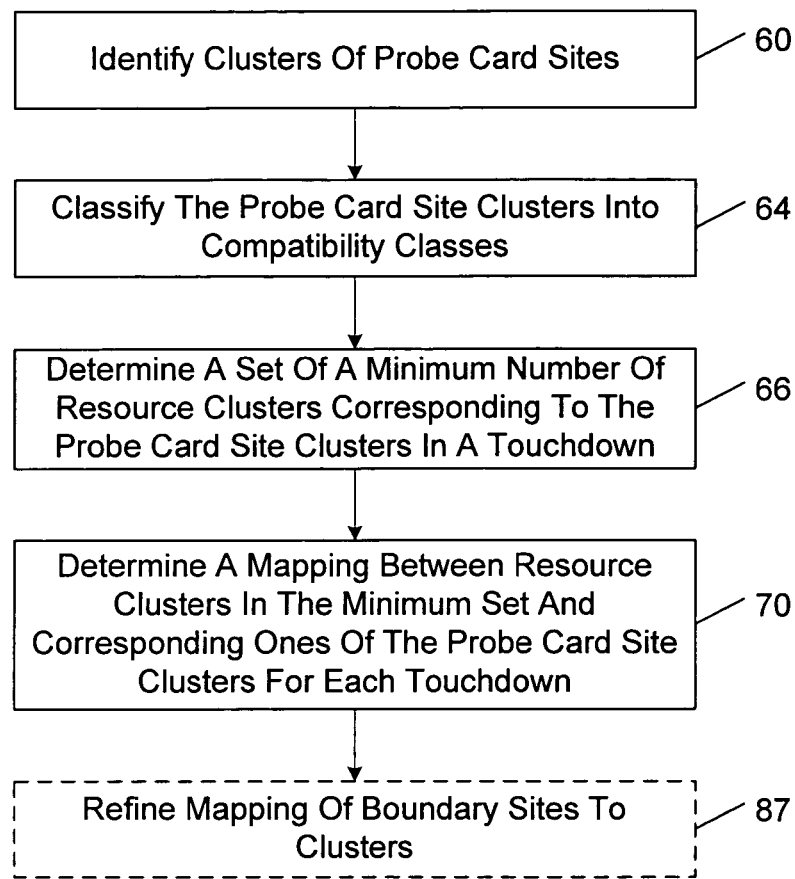
FIG. 9 is a flow diagram of an embodiment of a method of determining a set of connections between device testing resources and probe card sites.

FIG. 9 shows an embodiment of a cluster-based method of determining the set of connections between the resources and the probe card sites. In accordance with this method, clusters of probe card sites initially are identified (block 60). The probe card clusters are identified based on a superposition of intersections between the probe card and portions of a boundary encompassing the test site locations for all the touchdowns.

Figure 10:
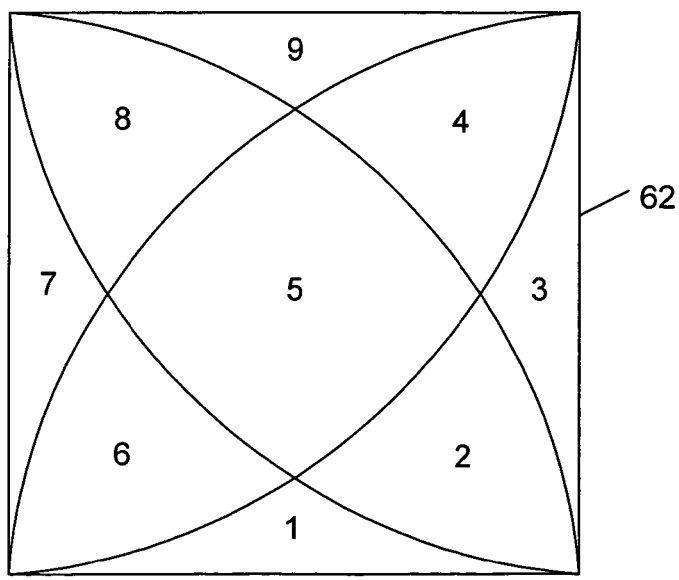
FIG. 10 is a diagrammatic view of regions of a probe card demarcated by a superposition of intersections between the probe card and portions of a boundary encompassing the test site locations for a set of four touchdowns.

FIG. 10 shows regions (numbered 1 through 9) of a probe card 62 that are demarcated by a superposition of intersections between the probe card 62 and portions of a boundary encompassing the test site locations on the substrate 54 for the set of four touchdowns A, B, C, and D. In the illustrated embodiment, the boundary corresponds to the edge of the substrate 54. FIG. 10 shows the curves across the probe card 62 that map physically to the arcuate edges of the substrate 54 for all of the touchdowns A, B, C, and D. Each cluster corresponds to a respective set of probe card sites that is physically bounded by the set of substrate edges for all of the touchdowns of the probe card onto the substrate 54.

Figure 11:
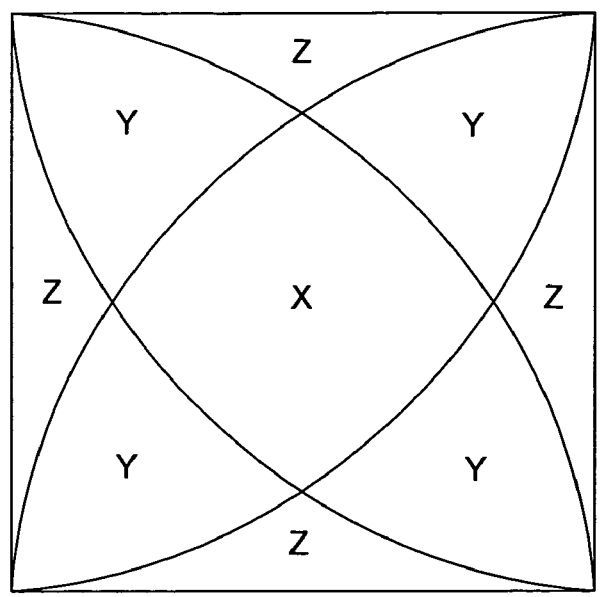
FIG. 11 shows the probe card regions of FIG. 10 labeled with compatibility class labels.

The probe card site clusters are classified into compatibility classes based on the numbers of probe card sites in the clusters (block 64). Probe card site clusters having the same size are referred to herein as "compatible" probe card site clusters. In the example shown in FIG. 10, the clusters are classified as follows: cluster 5 is unique; clusters 2, 4, 6, and 8 are of the same compatibility class; and clusters 1, 3, 7, and 9 are of the same compatibility class. FIG. 11 shows the results of the classification process 64, in which cluster 5 is classified as compatibility class X, clusters 2, 4, 6, and 8 are classified as compatibility class Y; and clusters 1, 3, 7, and 9 are classified as compatibility class Z.

Figure 12:
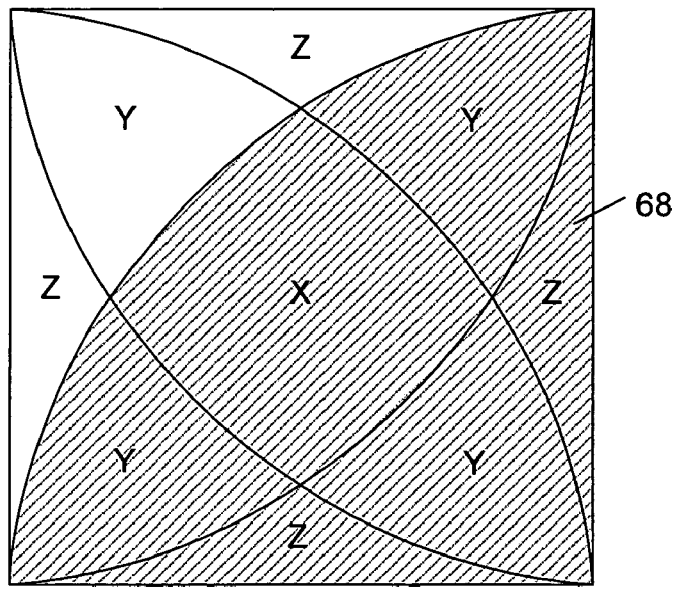
FIG. 12 shows the labeled probe card regions of FIG. 11 with a first touchdown area highlighted.

A set of a minimum number of resource clusters corresponding to the respective probe card site clusters in a selected one of the touchdowns is determined (block 66). Each of the touchdowns corresponds to a respective set of six probe card site clusters. As shown in FIG. 12, for example, touchdown A (shown highlighted by cross-hatching 68) corresponds to probe card site clusters 1 through 6. The resources are clustered in accordance with the probe card site clusters corresponding to the selected touchdown. In particular, each probe site cluster corresponding to the selected touchdown is associated with a respective resource cluster having the same number of resources as the number of probe card sites in the associated cluster. The resources are classified in accordance with the compatibility classes assigned to the associated probe card site clusters. Therefore, if touchdown A is selected, the minimum number of resource clusters is six: one of compatibility class X; three of compatibility class Y; and two of compatibility class Z.

A mapping between the resource clusters in the minimum set and corresponding ones of the probe card site clusters is determined for each touchdown (block 70). The mapping may be determined by using any one of a wide variety of known covering methods (e.g., the Quine-McCluskey minimization algorithm) that minimizes an explicit cost function. The cost function may be designed to track the number of multiplexers. Alternatively, the cost function may be designed to track the number of probe card site clusters with a site load greater than one.

Table 5 shows the resulting mapping for the set of probe card site clusters shown in FIGS. 10 and 11 that minimizes the number of multiplexers for the four touchdowns A, B, C, and D.

TABLE 5

| Resource Cluster | Muxed to Probe-card Cluster | | | | |
| --- | --- | --- | --- | --- | --- |
| | Touchdown A | Touchdown B | Touchdown C | | Touchdown D |
| Number | Type | Number | Type | Number | Type | Number | Type | Number | Type |
| 1 | Z | 1 | Z | 1 | Z | 9 | Z | 9 | Z |
| 2 | Y | 2 | Y | 2 | Y | 2 | Y | 8 | Y |
| 3 | Z | 3 | Z | 7 | Z | 3 | Z | 7 | Z |
| 4 | Y | 4 | Y | 8 | Y | 8 | Y | 4 | Y |
| 5 | X | 5 | X | 5 | X | 5 | X | 5 | X |
| 6 | Y | 6 | Y | 6 | Y | 4 | Y | 6 | Y |

Figure 13:
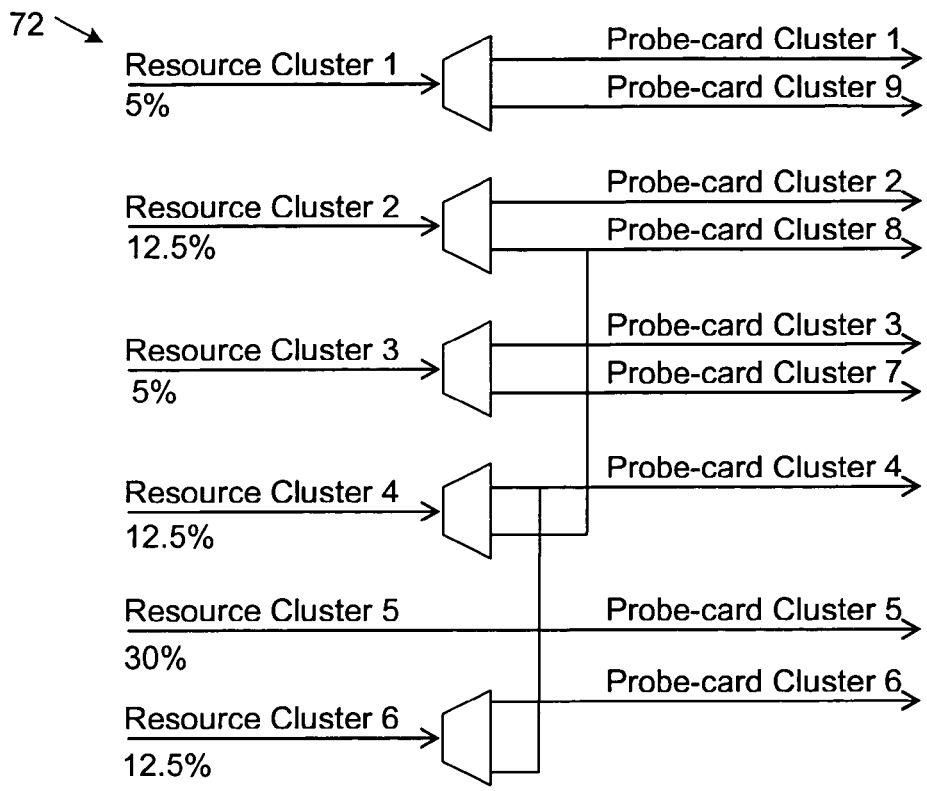
FIG. 13 is circuit diagram of an embodiment of a configurable interconnection network for allocating device testing resources among the sites of the probe card shown in FIG. 10.

FIG. 13 shows a configurable interconnection network 72 that corresponds to the mapping presented in Table 5. Interconnection network 72 includes only 1:2 multiplexers. In addition, the probe card sites in clusters 1-3, 5-7, and 9 have a site load of one and the probe card sites in clusters 4 and 8 have a site load of two.

Table 6 shows the resulting mapping for the set of probe card site clusters shown in FIGS. 10 and 11 that minimizes the number of probe card site clusters with a site load greater than one for the four touchdowns A, B, C, and D.

TABLE 6

| Resource Cluster | Muxed to Probe-card Cluster | | | | |
| --- | --- | --- | --- | --- | --- |
| | Touchdown A | Touchdown B | Touchdown C | | Touchdown D |
| Number | Type | Number | Type | Number | Type | Number | Type | Number | Type |
| 1 | Z | 1 | Z | 1 | Z | 9 | Z | 9 | Z |
| 2 | Y | 2 | Y | 2 | Y | 2 | Y | 8 | Y |

TABLE 6-continued

| Resource Cluster | Muxed to Probe-card Cluster | | | | |
| --- | --- | --- | --- | --- | --- |
| | Touchdown A | Touchdown B | Touchdown C | | Touchdown D |
| Number | Type | Number | Type | Number | Type | Number | Type | Number | Type |
| 3 | Z | 3 | Z | 7 | Z | 3 | Z | 7 | Z |
| 4 | Y | 4 | Y | 8 | Y | 4 | Y | 4 | Y |
| 5 | X | 5 | X | 5 | X | 5 | X | 5 | X |
| 6 | Y | 6 | Y | 6 | Y | 8 | Y | 6 | Y |

Figure 14:
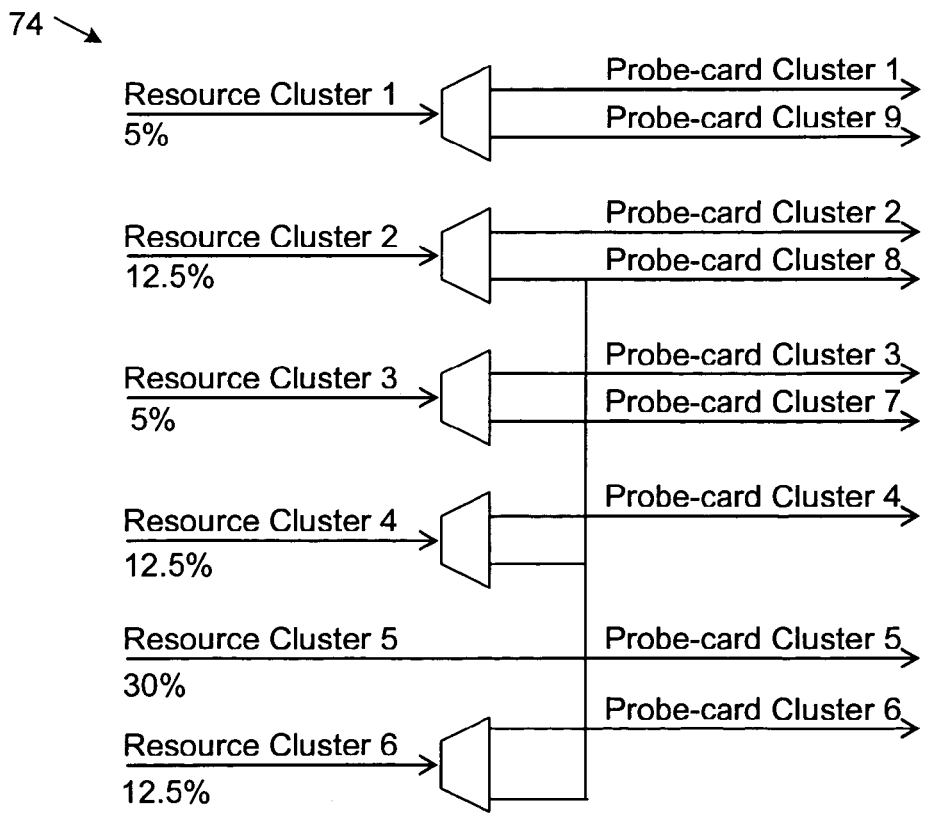
FIG. 14 is circuit diagram of an embodiment of a configurable interconnection network for allocating device testing resources among the sites of the probe card shown in FIG. 10.

FIG. 14 shows a configurable interconnection network 74 that corresponds to the mapping presented in Table 6. Interconnection network 74 includes only 1:2 multiplexers. In addition, the probe card sites in clusters 1-7, and 9 have a site load of one and the probe card sites in cluster 8 have a site load of three.

Figure 15:
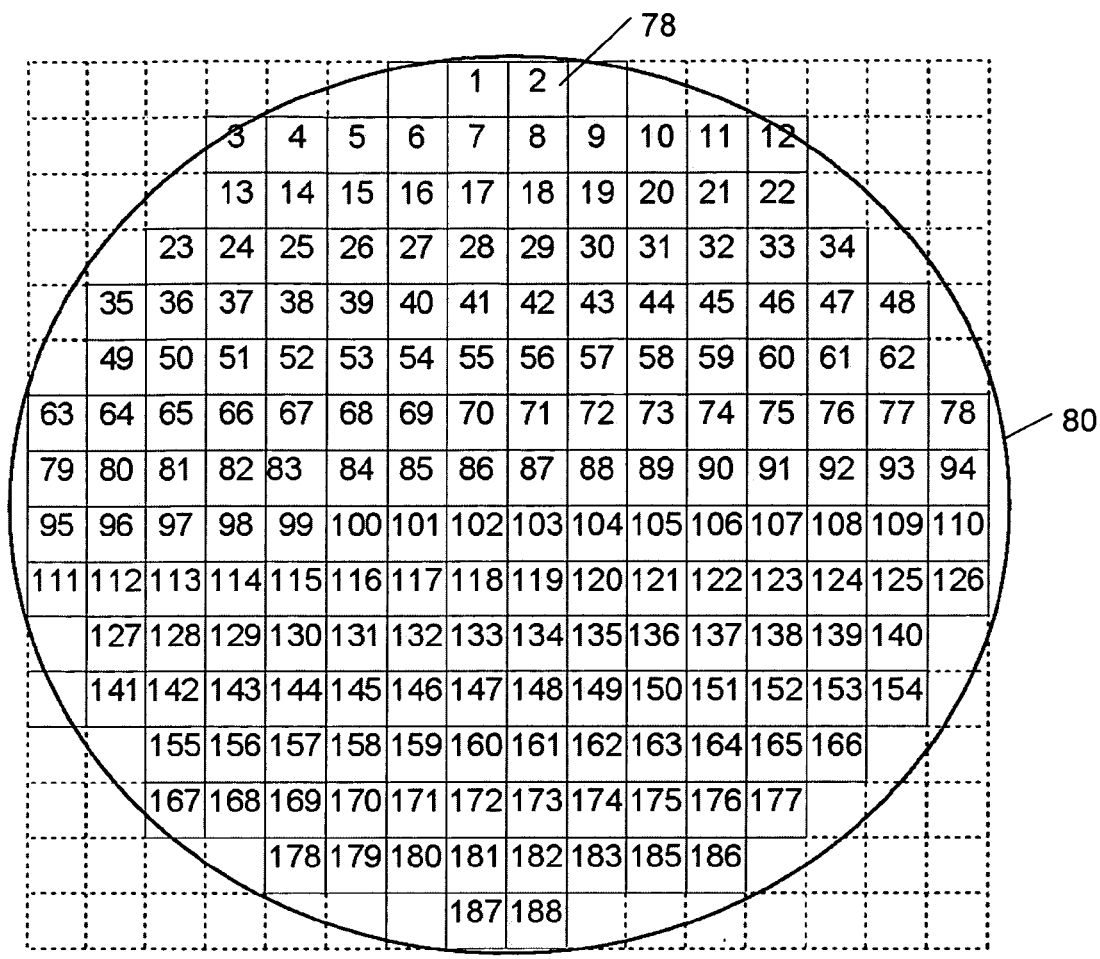
FIG. 15 is a diagrammatic view of an array of test site locations on a substrate.
Figure 16:
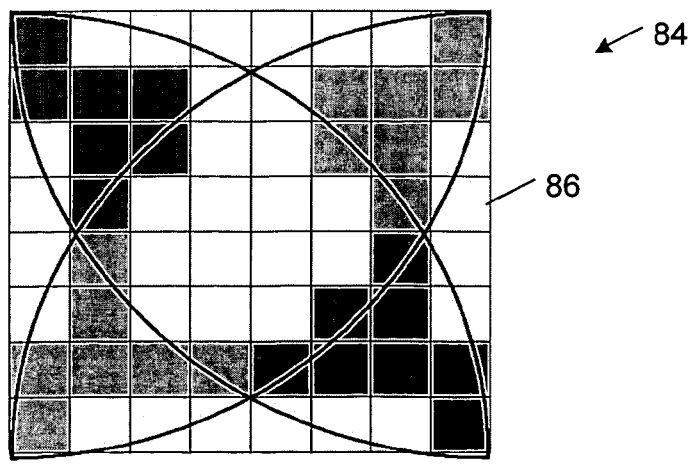
FIG. 16 is a diagrammatic view of regions of a probe card demarcated by a superposition of intersections between the probe card and portions of a boundary encompassing the test site locations for a set of four touchdowns.
Figure 17:
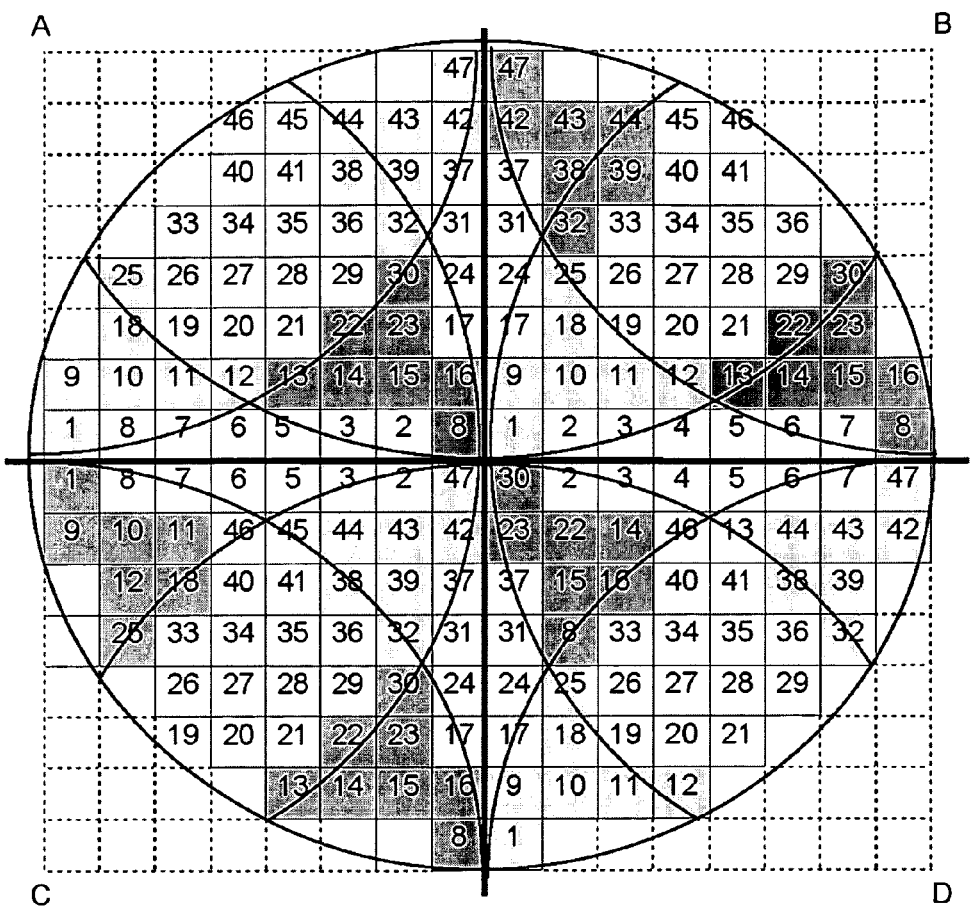
FIG. 17 shows four allocations of resources among the sites of the probe card shown in FIG. 16.

FIGS. 15-17 shows the results of applying the clustering method of FIG. 9 to an exemplary array of one hundred eighty-eight test site locations 78 (numbered 1 through 188) on a substrate 80. In this example, the probe card 84 includes an 8×8 array of sixty-four testing sites 86.

FIG. 16 shows the regions of the probe card 84 demarcated by a superposition of curved intersections between the probe card 84 and portions of the edge of the substrate 80 for a set of four touchdowns. The curved intersections segment the probe card sites into nine clusters. FIG. 16 also shows an optimal clustering of the probe card sites 86. This clustering may be determined by an initial coarse clustering process corresponding to blocks 60, 64, 66, and 70 of FIG. 9, followed by a process that refines the mapping of boundary sites to the clusters (block 87; FIG. 9). Boundary sites are probe card sites that are located on the boundaries between two clusters (e.g., probe card sites 13, 22, and 30 in touchdown A shown in FIG. 17). In some implementations, boundary sites are mapped to respective clusters by exhaustively considering all permutations of the boundary sites. Assuming that there are k boundary sites, there are on the order of $2^k$ permutations to consider. Since the number of boundary sites is significantly less than the total number of probe card sites, this method compares favorably to methods in which permutations of all probe card sites are exhaustively considered.

FIG. 17 shows the resulting allocations of resources among the sites of the probe card 84 for the four touchdowns A, B, C, and D. In this implementation, only forty-seven device testing resources are required to test all of the one hundred eighty-eight test sites in four touchdowns. This improves the utilization relative to the fixed resource allocation approach described above by 27%.

3. Performance Summary

Table 7 compares the architectures using the three metrics described above.

TABLE 7

| | N dies/substrate and M pins/die | | | | Example 188 die/substrate and 16 pins/die | | |
|---|---|---|---|---|---|---|---|
| Architecture | Number of Resources | Number of MUX's | MUX Type | Site Load (for % sites) | Number of Resources | Number of 1:2 Muxes | Reduction in MUX's |
| Fixed Approach | N | N/A | N/A | N/A | 1024 | N/A | N/A |
| Full Matrix Architecture | 0.78 NM | $(0.78\ NM)^2$ | 1:1 | NM for 100% | 752 | 565,504 | 1 x |
| Rotating Allocation | 0.78 NM | 0.78 NM | 1:4 | 4 for 100% | 752 | 1,760 | 321 x |
| Mirroring Allocation | 0.78 NM | 0.78 NM | 1:4 | 4 for 100% | 752 | 1,760 | 321 x |
| Cluster Allocation | 0.78 NM | 0.48 NM | 1:2 | 2 for 25% 3 for 12.5% | 752 | 360 | 1,569 x |

4. Alternative Implementations

Although the embodiments are described above in connection with implementations in which the minimum number of touchdowns four, other implementations may be designed for a different number of touchdowns.

Figure 18:
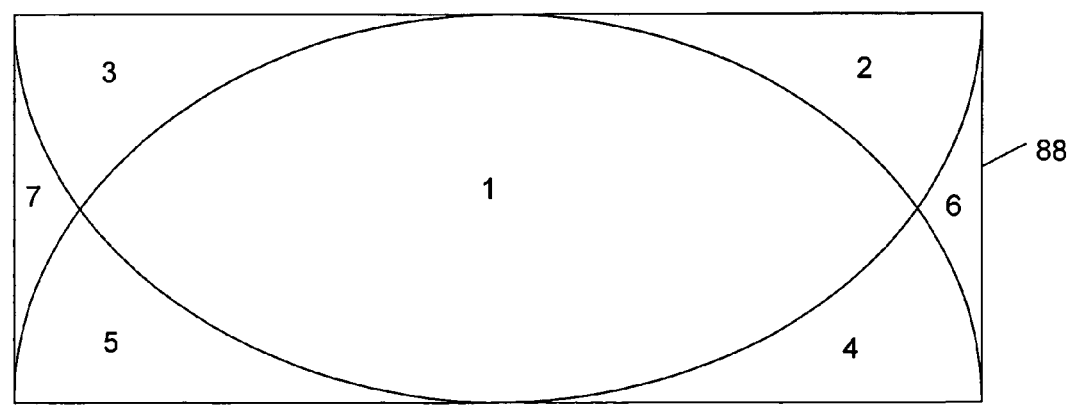
FIG. 18 is a diagrammatic view of regions of a probe card demarcated by a superposition of intersections between a probe card and portions of a boundary encompassing the test site locations for a set of two touchdowns.

For example, FIG. 18 shows an exemplary embodiment in which the sites on a probe card 88 are segmented into 7 clusters (numbered 1 through 7) that are demarcated by a superposition of intersections between the probe card 88 and the edges of a circular substrate for a set of two touchdowns.

In some implementations, the mirror-symmetric resource allocation method described above is applied to the embodiment of FIG. 18 to determine the set of connections between the resources and the probe card sites (block 52; FIG. 5). In these implementations, a 1:2 multiplexer is used for each of the resources.

In other implementations, the cluster-based resource allocation method described above is applied to the embodiment of FIG. 18 to determine the set of connections between the resources and the probe card sites (block 52; FIG. 5). In accordance with this method, probe card site cluster 1 is classified into compatibility class A, probe card site clusters 2-5 are classified into compatibility class B, and probe card site clusters are classified into compatibility class C.

There are three resource clusters (numbered 1-3) in each of the two touchdowns. In touchdown 1, resource clusters 1 maps to the probe card site cluster 1 and resource clusters 2 and 3 map to probe card site clusters 2 and 3. In touchdown 2, resource clusters 1 maps to the probe card site cluster 1 and resource clusters 2 and 3 map to probe card site clusters 4 and 5. Since probe card site clusters 6 and 7 do not correspond to test sites, they are not connected to any device testing resources.

Figure 19:
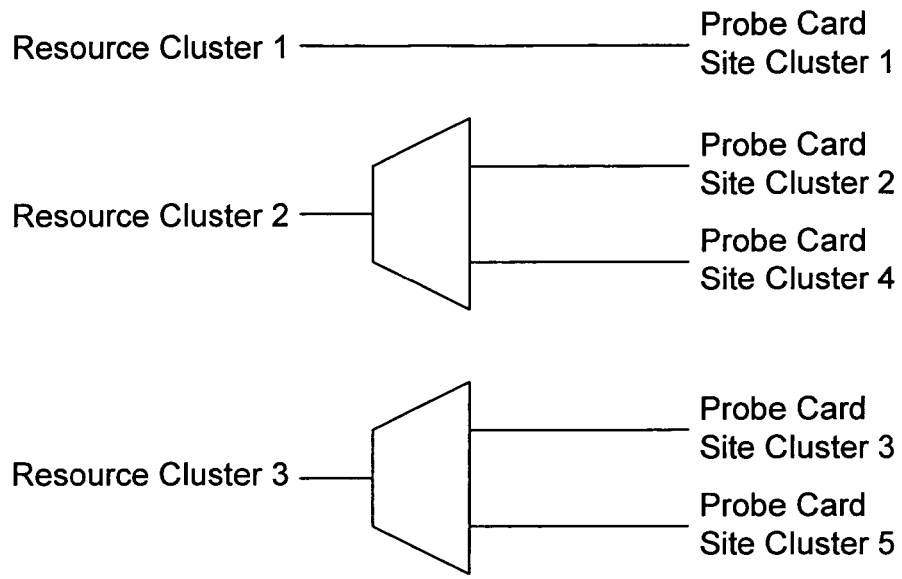
FIG. 19 is a circuit diagram of an implementation of a configurable interconnection network for allocating device testing resources among the sites of the probe card shown in FIG. 18.

FIG. 19 shows a configurable interconnection network 89 that corresponds to the mapping between the resource clusters 1-3 and the probe card site clusters 1-5 for the two touchdowns. In this mapping, the number of 1:2 multiplexers is less than the mirror-symmetric method and significantly less than the multiplex matrix method described above in connection with FIG. 4.

II. Allocating Device Testing Resources to Sites on Multiple Probe Cards

Figure 20:
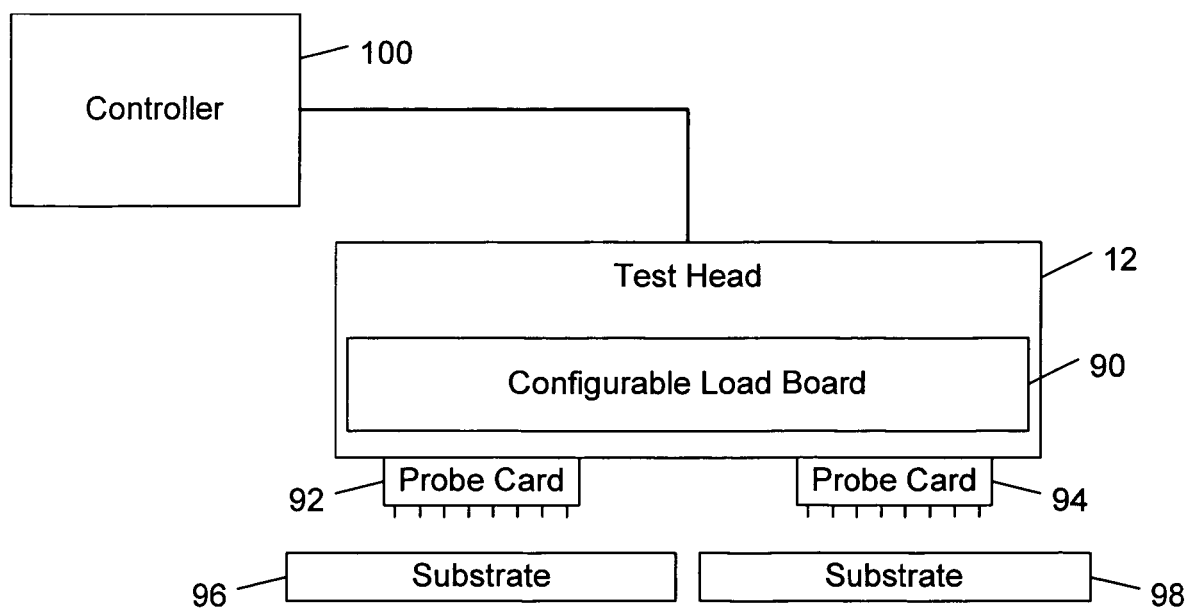
FIG. 20 is a block diagram of a test head that includes a configurable interconnection network for allocating resources among the test sites of two probe cards.

FIG. 20 shows an embodiment of the test head 12 that includes a configurable interconnection network 90 that is configured to allocate device testing resources among the sites on multiple probe cards 92, 94. The probe cards 92, 94 are configured to contact test sites on multiple respective substrates 96, 98. A controller 100 configures the interconnection network to concurrently connect the device testing resources to selected ones of the test sites on the different substrates 96, 98 to maximize utilization of the resources.

In operation, the test sites of the probe cards 92, 94 are brought into contact with test sites on the substrates 96, 98. The controller 100 directs the switches in the configurable interconnection network 90 to concurrently connect the device testing resources to selected ones of the contacted test sites on the different substrates 96, 98 to maximize utilization of the resources. The controller 100 schedules the concurrent connection of the resources to test sites on different substrates over multiple touchdowns in a way that maximizes substrate throughput.

Figure 21:
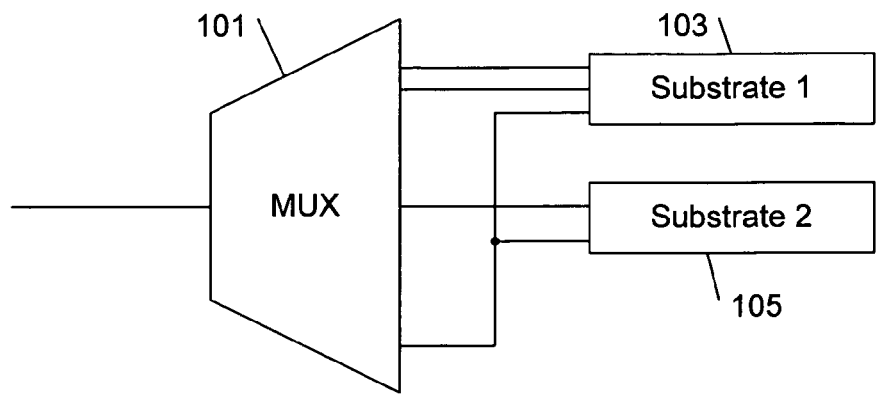
FIG. 21 is a diagrammatic view of an implementation of a multiplexer of a configurable interconnection network that has outputs that fan-out to multiple substrates.

As shown diagrammatically in FIG. 21, in some implementations, the outputs of at least some of the multiplexers in the configurable interconnection network 90 fan out to multiple substrates. In this way, the same resource can be used for multiple substrates without imposing a testing delay. In the exemplary implementations shown in FIG. 21, the 1×4 multiplexer 101 may operate in three different states: in the first state, the multiplexer 101 is connected to substrates 103 and 105; in the second state, the multiplexer 101 is connected to only substrate 103; and in the third state, the multiplexer 101 is connected to only substrate 105.

In general, the numbers and arrangements of testing sites on the probe cards 92, 94 may be the same or different.

Figure 22:
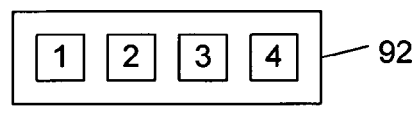
FIG. 22 is a diagrammatic view of implementations of the probe cards shown in FIG. 20.
Figure 22:
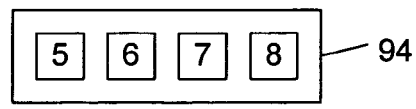
Figure 23:
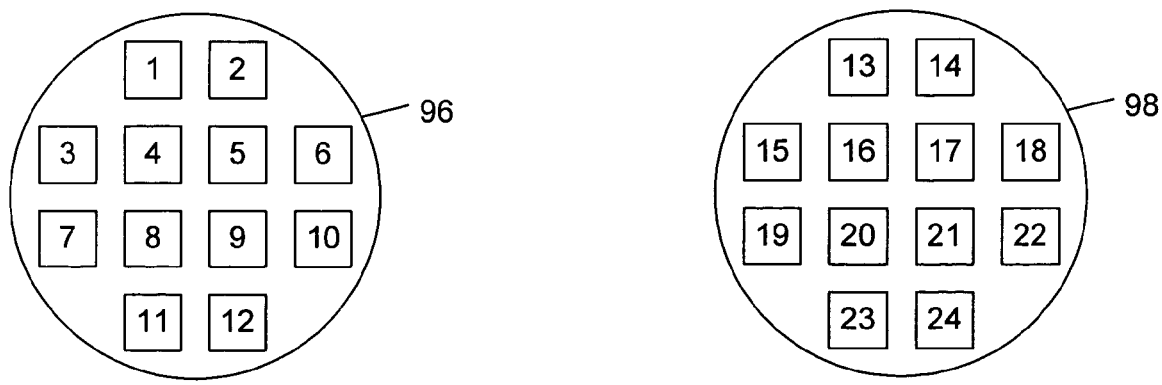
FIG. 23 is a diagrammatic view of the test site locations on implementations of the substrates shown in FIG. 20.

Similarly, the numbers and arrangements of the test sites on the substrates 96, 98 may be the same or different. FIG. 22 shows implementations of the probe cards 92, 94 that include identical linear arrays of four testing sites (numbered 1-4 and 4-8, respectively). FIG. 23 shows implementations of the substrates 96, 98 that respectively include identical non-rectangular arrays of twelve test sites (numbered 1-12 and 13-24, respectively).

Figure 24:
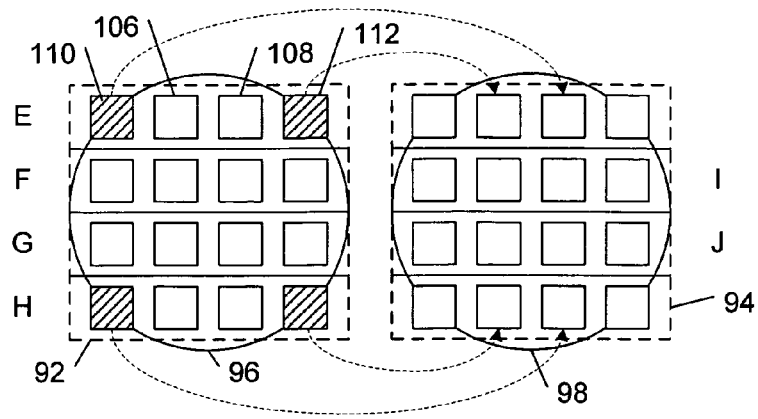
FIG. 24 is a diagrammatic view of a superposition of multiple touchdowns of the probe cards onto the substrates shown in FIG. 20 that shows an exemplary allocation of the resources among the test sites of the two probe cards.

FIG. 24 shows an exemplary set of six touchdowns (labeled E, F, G, H, I, and J) of the probe cards 92, 94 onto the substrates 96, 98 that maximizes the utilization of four resources that are allocated among the testing sites of the probe cards 92, 94 and that maximizes substrate throughput. During touchdown E, two testing sites 106, 108 of the probe card 92 contact the two test sites in the top row of test sites on substrate 96, and the other two testing sites 110, 112 of the probe card 92 do not contact any test site locations on the substrate 96. Accordingly, during touchdown E, two of the resources are allocated to testing sites 2 and 3 of probe card 92 and two resources are allocated to testing sites 13 and 14 of probe card 94. During touchdowns F and G, the four resources are allocated to sites 3-6 and 7-10 of probe card 92, respectively. During touchdown H, two of the resources are allocated to testing sites 11 and 12 of probe card 92 and two resources are allocated to testing sites 23 and 24 of probe card 94. During touchdowns I and J, the four resources are allocated to sites 15-18 and 19-22 of probe card 94, respectively.

In a comparable approach in which four resources are connected to the test site locations through only one of the probe cards 92, 94, eight touchdowns are required. Therefore, the example shown in FIG. 24, which requires only six touchdowns, improves the substrate throughput considerably (i.e., by 25%).

III. Implementations of Configurable Interconnection Network

In general, the configurable interconnection networks that are described herein may be implemented in a wide variety of different ways. As explained above, the configurable interconnection networks include resource allocation components that may be disposed at one or more locations along the communications paths between the device testing resources and the devices to be tested.

Figure 25:
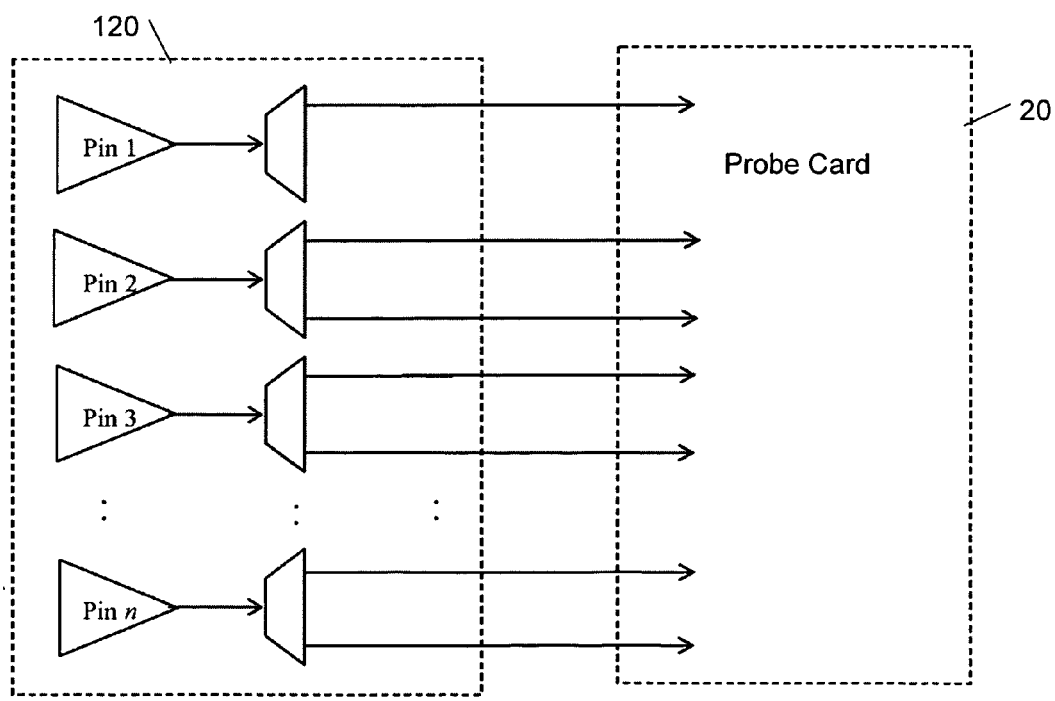
FIG. 25 is a circuit diagram of an implementation of a configurable interconnection network.
Figure 26:
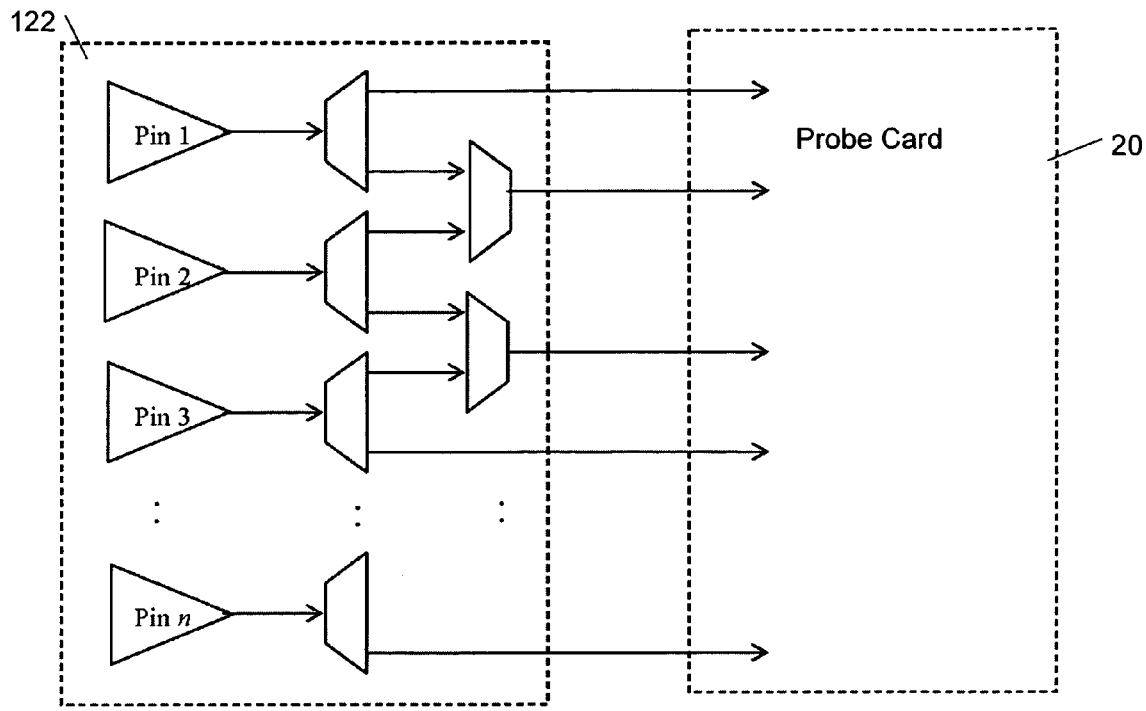
FIG. 26 is a circuit diagram of an implementation of a configurable interconnection network.

For example, in some implementations, each configuration is implemented as a customized circuit card. FIG. 25 shows an implementation of a generic card 120 that can be configured to implement all of the different switching arrangements described above. In this implementation, the interconnections allocating the resources among the probe card sites may be made on the probe card 20. FIG. 26 shows an implementation of a generic card 122 in which the interconnections allocating the resources among the probe card sites are made within the card 122.

Figure 27:
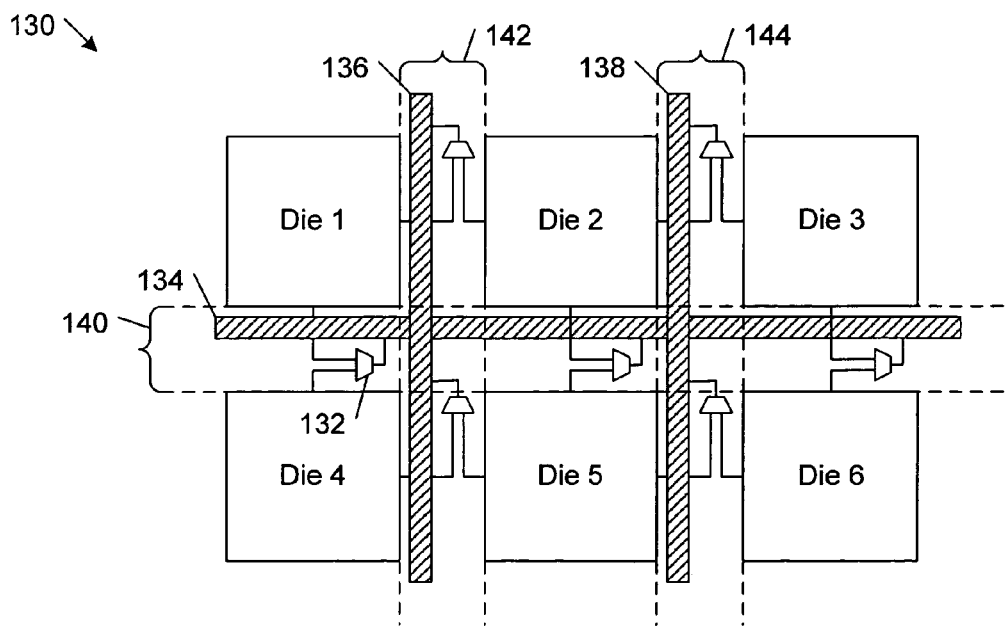
FIG. 27 is a block diagram of a substrate that includes components of a configurable interconnection network located in scribe lines between adjacent dice.

FIG. 27 shows a portion of an embodiment of a substrate 130 that includes components (e.g., multiplexers 132 and electrical traces 134, 136, 138) of a configurable interconnection network. These components are located in the scribe lines 140, 142, 144 between adjacent dice. As used herein, the term "scribe line" refers to the sacrificial areas between adjacent dice; these areas will be removed during a scribing or dicing process in which the individual dice are separated from one another. In other embodiments, the outputs of the multiplexers 132 may fan-out to more than two dice. Components of the configurable interconnection network may be located in areas of the substrate 130 outside of the scribe lines 140, 142, 144. For example, in some embodiments, components of the configurable interconnection network are located in the die areas of the substrate 130 in addition to or instead of in the scribe lines 140, 142, 144.

IV. Conclusion

The resource allocation methods described herein may be implemented in any computing or processing environment, including in digital electronic circuitry or in computer hardware, firmware, or software. These methods may be performed by a computer processor executing instructions organized, for example, into process modules to carry out these methods by operating on input data and generating output. Suitable processors include, for example, both general and special purpose microprocessors. Generally, a processor receives instructions and data from a read-only memory and/or a random access memory. Storage devices suitable for tangibly embodying computer process instructions include all forms of non-volatile memory, including, for example, semiconductor memory devices, such as EPROM, EEPROM, and flash memory devices; magnetic disks such as internal hard disks and removable disks; magneto-optical disks; and CD-ROM. Any of the foregoing technologies may be supplemented by or incorporated in specially designed ASICs (application-specific integrated circuits).

Other embodiments are within the scope of the claims.

What is claimed is:

1. A system for allocating m resources for testing devices to n sites of a probe card configured to electrically connect to respective test site locations on a substrate, where m and n are integers and m<n, the system comprising:
   a configurable interconnection network comprising a plurality of connections between the m resources and the n probe card sites enabling each of the test site locations to be connected to at least one of the resources over a minimum number of touchdowns of the probe card onto the test site locations, wherein the interconnection network selectively connects each of the resources to a number of the probe card sites less than n and at most equal to the minimum number of touchdowns.

2. The system of claim 1, wherein the connections provide a symmetric allocation of the resources among the probe card sites for different touchdowns.

3. The system of claim 2, wherein the resource allocations for different touchdowns are rotation-symmetric.

4. The system of claim 2, wherein the resource allocations for different touchdowns are mirror-symmetric.

5. The system of claim 1, wherein the minimum number of touchdowns is four and each of the connections comprises a 1:4 multiplexer configured to connect a respective resource to a respective set of four probe card sites.

6. The system of claim 1, wherein at least some of the connections comprise 1:2 multiplexers configured to connect a respective resource to a respective set of two probe card sites.

7. The system of claim 1, wherein the connections allocate for each touchdown clusters of resources in a set to corresponding ones of clusters of probe card sites.

8. The system of claim 7, wherein the probe card site clusters correspond to regions of the probe card demarcated by a superposition of intersections between the probe card and portions of a boundary encompassing the test site locations for all of the minimum number of touchdowns.

9. The system of claim 8, wherein the set of resource clusters corresponds to the respective probe card site clusters in one of the touchdowns.

10. The system of claim 9, wherein the configurable interconnection network comprises multiplexers for selectively connecting resource clusters in the set to compatible probe card sites in different touchdowns.

11. The system of claim 1, wherein at least some of the connections of the configurable interconnection network are located on the substrate.

12. The system of claim 11, wherein at least some of the connections of the configurable interconnection network are located in scribe lines between dice on the substrate.

13. A method of allocating m resources for testing devices to n sites of a probe card configured to electrically connect to respective test site locations on a substrate, where m and n are integers and m<n, the method comprising:
(a) determining a minimum number of touchdowns of the probe card onto the test site locations enabling each test site location to be electrically connected to at least one respective probe card site; and
(b) determining a set of connections between the m resources and the n probe card sites enabling each test site location to be connected to at least one of the resources, wherein the set of connections selectively connects each of the resources to a number of the probe card sites less than n and at most equal to the minimum number of touchdowns.

14. The method of claim 13, wherein (b) comprises determining connections providing a symmetric allocation of the resources among the probe card sites for different touchdowns.

15. The method of claim 14, wherein the resource allocations for different touchdowns are rotation-symmetric.

16. The method of claim 14, wherein the resource allocations for different touchdowns are mirror-symmetric.

17. The method of claim 13, wherein (b) comprises identifying respective sets of active ones of the probe card sites that are electrically connectable to respective ones of the test sites during respective ones of the touchdowns.

18. The method of claim 17, wherein (b) comprises identifying clusters of probe card sites based on a superposition of intersections between the probe card and portions of a boundary encompassing the test site locations for all the touchdowns.

19. The method of claim 18, further comprising constructing a configurable interconnection network comprising the determined set of connections, wherein the connections allocate for each of the touchdowns clusters of resources in a set to corresponding ones of the identified clusters of probe card sites.

20. The method of claim 18, wherein (b) comprises classifying the probe card site clusters based on numbers of probe card sites in the clusters.

21. The method of claim 20, wherein (b) comprises determining a set of a minimum number of resource clusters corresponding to the respective probe card site clusters in one of the touchdowns.

22. The method of claim 21, wherein (b) comprises determining a mapping between the resource clusters in the set and corresponding ones of the probe card site clusters for each touchdown.

23. The method of claim 22, wherein determining the mapping comprises assigning probe card sites on cluster boundaries to respective clusters.

24. The method of claim 22, wherein (b) comprises minimizing connections between the resource clusters and corresponding ones of the probe card site clusters in accordance with the mapping.

25. The method of claim 22, wherein (b) comprises minimizing probe card sites connected to respective resources through more than one connection in accordance with the mapping.

26. The method of claim 22, wherein (b) comprises determining the set of connections based on the mapping.

27. The method of claim 13, further comprising interconnecting the resources and the probe card sites with the determined set of connections.

28. The method of claim 13, further comprising constructing a configurable interconnection network comprising the determined set of connections.

* * * * *